(12) United States Patent
Hühn

(10) Patent No.: US 10,476,517 B2
(45) Date of Patent: Nov. 12, 2019

(54) MODULATOR FOR A DIGITAL AMPLIFIER

(71) Applicant: Forschungsverbund Berlin e.V., Berlin (DE)

(72) Inventor: Florian Hühn, Berlin (DE)

(73) Assignee: Forschungsverbund Berlin e.V., Berlin (DE)

(*) Notice: Subject to any disclaimer, the term of this patent is extended or adjusted under 35 U.S.C. 154(b) by 0 days.

(21) Appl. No.: 16/092,883

(22) PCT Filed: Apr. 12, 2017

(86) PCT No.: PCT/EP2017/058790
§ 371 (c)(1),
(2) Date: Oct. 11, 2018

(87) PCT Pub. No.: WO2017/178534
PCT Pub. Date: Oct. 19, 2017

(65) Prior Publication Data
US 2019/0131999 A1 May 2, 2019

(30) Foreign Application Priority Data

Apr. 13, 2016 (DE) .................. 10 2016 106 790

(51) Int. Cl.
*H03M 3/00* (2006.01)
*H03F 3/189* (2006.01)
(Continued)

(52) U.S. Cl.
CPC ............ *H03M 3/404* (2013.01); *H03F 3/189* (2013.01); *H03F 3/217* (2013.01); *H03F 3/38* (2013.01);
(Continued)

(58) Field of Classification Search
CPC ........ H03M 3/404; H03F 3/189; H03F 3/217; H03F 3/38; H03F 3/387; H03F 2200/339; H04L 27/2092
See application file for complete search history.

(56) References Cited

U.S. PATENT DOCUMENTS

| 2009/0167431 | A1* | 7/2009 | Guilherme | .............. H03F 3/187 330/10 |
| 2011/0267127 | A1* | 11/2011 | Staszewski | ........... H03F 3/2176 327/306 |
| 2015/0280732 | A1* | 10/2015 | Beaulaton | ............ H03M 3/404 341/143 |

FOREIGN PATENT DOCUMENTS

| EP | 2263355 | 9/2012 |
| EP | 2750288 | 7/2014 |
| WO | WO02/073821 | 9/2002 |

OTHER PUBLICATIONS

Hori, S.et al., "A 0.7-3GHz Envelope ΔΣ Modulator Using Phase Modulated Carrier Clock for Multi-mode/band Switching Amplifiers", Radio Frequency Integrated Circuits Symposium (RFIC) 2011, Jun. 5-7, 2011, pp. 1-4.

(Continued)

*Primary Examiner* — Jaison Joseph
(74) *Attorney, Agent, or Firm* — Ray Quinney & Nebeker P.C.; Paul N. Taylor

(57) ABSTRACT

The present disclosure relates to a modulator for a digital amplifier and a device comprising such a modulator and a digital amplifier.
The modulator includes a pulse shaper and a control unit for controlling the pulse shaper to convert an input signal into a bit stream configured for a digital amplifier which encodes an amplitude value per clock of a carrier signal. The pulse shaper can represent a respective amplitude value of the input signal with different bit patterns. The control unit (Continued)

Figure 1:
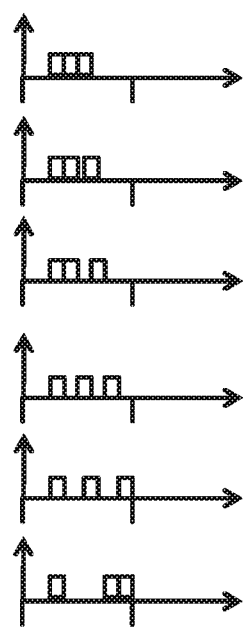

includes an assignment of the control commands to associated amplitude values resulting from amplification of the associated bit patterns with the digital amplifier is stored or at least is provided in that the control unit selects a control command per clock by means of the assignment and the amplitude value of the input signal and drives the pulse shaper accordingly.

16 Claims, 12 Drawing Sheets

(51) Int. Cl.
    *H03F 3/217*     (2006.01)
    *H03F 3/38*     (2006.01)
    *H03F 3/387*     (2006.01)
    *H04L 27/20*     (2006.01)

(52) U.S. Cl.
    CPC ......... *H03F 3/387* (2013.01); *H04L 27/2092* (2013.01); *H03F 2200/339* (2013.01)

(56) References Cited

OTHER PUBLICATIONS

Raab, F., "Radio Frequency Pulsewidth Modulation", IEEE Transactions on Communications, pp. 958-966, Aug. 1973.
Schemel, R.E., "Neoteric signal: method for linearising narrow-band amplifiers or signal paths up to their peak powers," Electronic Letters, vol. 36, Nr. 7, S. 666-667, Mar. 30, 2000.
Wagh, P. et al., "Distortionless RF Pulse Width Modulation," The 2002 45th Midwest Symposium on Circuits and Systems, p. 124-127, 2002.
Stauth, J.T., et al., "Pulse-Density Modulation for RF Applications: The Radio-Frequency Power Amplifier (RF PA) as a Power Converter", Power Electronics Specialists Conferenece, Jun. 15, 2008, pp. 3563-3568.
International Search Report for PCT/EP2017/058790, dated May 17, 2017, 3 pages.

\* cited by examiner

Figure 1 – Prior Art

Figure 2 — Prior Art

MODULATOR FOR A DIGITAL AMPLIFIER

CROSS REFERENCE TO RELATED APPLICATIONS

This application is a U.S. Nationalization of PCT Application Number PCT/EP2017/058790, filed on Apr. 12, 2017, which claims priority to German Patent Application No. 10 2016 106 790.3, filed on Apr. 13, 2016, the entireties of which are incorporated herein by reference.

The present invention relates to a modulator for a digital amplifier and a device with such a modulator and a digital amplifier.

STATE OF THE ART

Digital power amplifiers, also called digital amplifiers for short, and power controllers have rapidly established in the low frequency range in recent years due to their many advantages. In particular, the consistently high efficiency over almost the entire output power range enables extremely energy-efficient and thus environmentally friendly operation.

In the field of microwave technology, however, digital amplifiers have not yet been able to establish. The simultaneous reaching of a high output power with good energy efficiency as well as high bandwidth and linearity still represent great challenges in view of the low reserves to the frequency limits of the transistors.

Digital amplifiers generate a value-discrete output signal, in the simplest design a binary signal, into which the desired analog output signal is encoded in such a way that intermediate values of the output signal can be restored by simple bandpass filtering at the output of the amplifier. The arrangement that correspondingly encodes the signal to be amplified into an input signal of the digital amplifier is called a modulator. For high-frequency signals (RF signals), physical and technical framework conditions prevent the adoption of the modulation types known from the low-frequency range.

The purpose of the modulator is to generate such a bit stream from the input signal, which can be amplified by the amplifier with the highest possible efficiency, and which, after passing the band filter at the output, corresponds to an amplified version of the input signal of the modulator which is upconverted onto the carrier frequency.

In modem communication systems, the input signal typically comprises both variations in its phase position and its amplitude that encode the information to be transmitted. It is available either as an analog signal or as a digital representation of an analog signal with sufficiently high amplitude and time resolution for the respective task.

Two modulation methods for digital amplifiers are known from the state of the art. S. Hori describes in "A 0.7-3 GHz envelope ΔΣ modulator using phase modulated carrier clock for multi-mode/band switching amplifiers", Radio Frequency Integrated Circuits Symposium (RFIC) 2011, 5-7 Jun. 2011, pp. 1-4, Envelope Delta Sigma Modulation (EDSM). EDSM generates no or exactly one pulse per oscillation of the phase-modulated carrier signal. It is not possible to fine-tune the resulting output amplitude using pulse width.

Another method is Band Pass Delta Sigma Modulation (BPDSM), for example described in US 2015/0280732 A1. The BPDSM requires oversampling of the RF signal, resulting in an increased number of switching operations per carrier frequency period, resulting in decharging and charging losses in the amplifier.

Further modulation methods are described in F. Raab, "Radio Frequency Pulse Width Modulation," IEEE Transactions on Communications, pp. 958-966, August 1973, R. Schemel, "Neoteric signal: method for linearising narrow-band amplifiers or signal paths up to their peak powers," Electronic Letters, Vol. 36, Nr. 7, S. 666-667, 30 Mar. 2000, and P. Wagh," Distortionless RF Pulse Width Modulation," The 2002 45th Midwest Symposium on Circuits and Systems, p. 124-127, 2002.

Modulators can then comprise a pulse shaper, for example. The bit patterning adjusts an impulse response to the amplifier and converts the input signal into a bit stream configured for a digital amplifier.

Pulse shapers generate the bit stream using an amplitude value and a phase of the input signal and a clock frequency of a carrier signal. The total width of all pulses in a clock of the carrier signal represents for example the amplitude value and a first pulse represent the phase. Some pulse shapers can represent a respective amplitude value in different ways. For example, an amplitude value of three can be represented as three pulses of a unit width, one pulse of correspondingly triple width or two pulses with a total width corresponding to three-unit widths. This is exemplarily shown in FIG. 1 and FIG. 2. In addition, the pulse pause between the pulses can be varied. These different ways are also called waveforms or bit patterns.

DISCLOSURE OF THE INVENTION

According to the invention, a modulator according to claim 1 is introduced for a digital amplifier. The modulator comprises a pulse shaper and a control unit for controlling the pulse shaper to convert an input signal into a bit stream configured for the digital amplifier, which encodes at least one amplitude value of the input signal in the clock of a clock signal. The pulse shaper can represent a respective amplitude value of the input signal with different bit patterns. The respective bit pattern used by the pulse shaper is determined by the control unit by means of a corresponding, associated control command. The modulator is characterized in that an assignment of the control commands to associated amplitude values resulting from amplification of the associated bit patterns with the digital amplifier is stored in the control unit or at least that the control unit selects one control command per clock by means of the assignment and the amplitude value of the input signal and controls the pulse shaper accordingly.

The proposed modulator can be parameterized with regard to the capabilities of the hardware that can be achieved in the respective implementation, in particular the bit patterning and/or the digitally amplifying hardware, by the assignability of control commands to the actual resulting amplitude value in accordance with the digital amplifier. The phase length actually resulting after the amplifier can also be recorded and stored in the waveform table. In this way, the actual phase error of the amplifier can also be corrected. By suitable selection by using the assignment, the modulator can be optimized for the respective digital amplifier whose resulting amplitude values are assigned to the control commands, for example with regard to purity of spectrum, filter requirements and/or amplifier efficiency.

Due to its assignability, the modulator can be used advantageously to improve the conversion of the input signal into a digitally amplified output signal.

The present invention describes a new modulator that reduces the disadvantages of previously known methods. It can be implemented in digital circuit technology or using simple signal-generating blocks. Digital circuits permit greater component tolerance and thus a more cost-effective manufacturing and calibration process.

In a preferred embodiment, the modulator comprises a memory in which the amplitude values resulting from the amplification of the different bit patterns with the amplifier are assigned to the control commands. The control unit can be adapted to determine the bit pattern to be generated by using the amplitude value of the input signal and the resulting amplitude values.

With suitable choice of the entries in the bit pattern assignment, the modulator has an optimized encoding efficiency.

This enables a quick and easy optimization of the bitstream for the amplifier.

The control unit can be adapted to change at least one stored assignment of a resulting amplitude value to one of the different bit patterns at least once.

This makes the modulator configurable or adaptable to different amplifiers and/or changes in amplifier characteristics during operation.

The bit patterns can differ by different phases.

This makes it possible to generate a bit stream even more suitable for the amplifier. Through the possibility of generating different bit patterns per clock (oscillation) of the phase-modulated carrier signal, the detail fidelity of the resulting output signal is increased. This is expressed in a purer output spectrum and lower requirements for a bandpass filter.

The modulator may comprise an amplitude modulator. The amplitude modulator can be adapted to encode the amplitude value of the input signal and provide it to the control unit. The control unit can also be adapted to use the encoded signal to determine the bit pattern to be generated.

The amplitude modulator can further be adapted to encode the amplitude value of the input signal by using the resulting amplitude value of a previously used bit pattern.

This allows noise to be reduced. In particular, using the stored resulting amplitude value instead of an actual resulting amplitude value reduces a feedback delay and thus a surge of oscillation of the amplitude modulator.

The amplitude modulator can be adapted to encode the amplitude value by using a carrier signal modulated with the phase, which serves as a clock signal for the amplitude modulator. A phase position correction value can also be recorded and stored in the waveform table. In this way, the actual phase error of the amplifier can also be corrected.

The modulator may further comprise an input stage adapted to generate the phase-modulated carrier signal and an envelope signal representing the amplitude from a complex-valued representation of the input signal and a carrier signal and to provide it to the amplitude modulator.

The pulse shaper may be adapted to generate a preliminary bit stream from the phase-modulated carrier signal and to delay it using the phase which is at least co-determined by the amplitude value in order to generate the bit stream. The phase describes how far the phase position of the resulting pulse after the amplifier deviates from the desired ideal and is synonymous with a delay necessary to compensate for the deviation. The assignment may contain two different bit patterns for one resulting amplitude value, which differ in phase or delay.

The pulse shaper may be adapted to generate the preliminary bit stream through a serialization circuit with m times oversampling, wherein m is a natural number greater than or equal to one.

The pulse shaper can perform a phase shift in addition to bit pattern generation.

Furthermore, according to the invention, a device according to claim 10 is provided for converting an input signal into a digitally amplified signal. The device comprises a modulator according to the invention and the digital amplifier.

The device may comprise a bandpass filter subordinate to the digital amplifier, which generates the output signal by broadband filtering. The control unit can be adapted to use the amplitude value resulting from the digital amplification and the bandpass filtering to determine the amplitude value to be generated.

The amplitude modulator can, for example, be a first-order or higher-order delta-sigma modulator. A delta sigma modulator encodes the envelope signal using the phase-modulated carrier signal by means of negative feedback. In particular, a resulting amplitude value can be fed back from the assignment, which is assigned to a previously used bit pattern. The encoding can be based on a clock division of the phase-modulated carrier signal that generates an encoded signal in d clocks each, wherein d is a natural number greater than or equal to one. The noise shaping properties of a delta sigma modulator improve signal quality through the feedback and enable the use of a wider variety of bandpass filters due to reduced requirements.

The baseband signal can in turn be provided by an input stage that converts a complex-valued input signal by using the carrier frequency into the phase-modulated carrier signal and an envelope signal.

The control unit can be defined to a predetermined pulse shaper and a predetermined amplifier. The control unit can only be defined to a predetermined pulse shaper and can be adjustable to an actual behavior of the amplifier using the digital output signal, initial and/or at later times. The assignment can be adjusted using the actual resulting amplitude values. In this way, the actual efficiency and/or the actual linearity of the conversion can be initially and/or later, especially also repetitively, improved, in particular optimized. The adjustment can be performed for example in a damped, iterative and/or incremental manner to avoid parameter jumps due to the adjustment.

The control command to the pulse shaper can be based on the fact that the control unit determines a resulting amplitude value to the amplitude value in an assignment of amplitude values resulting at least from digital amplification stored in a memory to the control commands and controls the pulse shaper accordingly. The resulting amplitude value with the smallest distance to the amplitude value of the input signal can be determined and used. The smallest distance can be determined in the entire assignment or in a subset, which in turn is determined, for example, by previously determined bit patterns. In particular, the assignment can assign a control command for a so-called zero pulse to one or more amplitude values, wherein the pulse shaper can be adapted not to form a pulse if it is controlled with this control command.

Advantageous developments of the invention are specified in the sub claims and described in the description.

DRAWINGS

Figure 2:
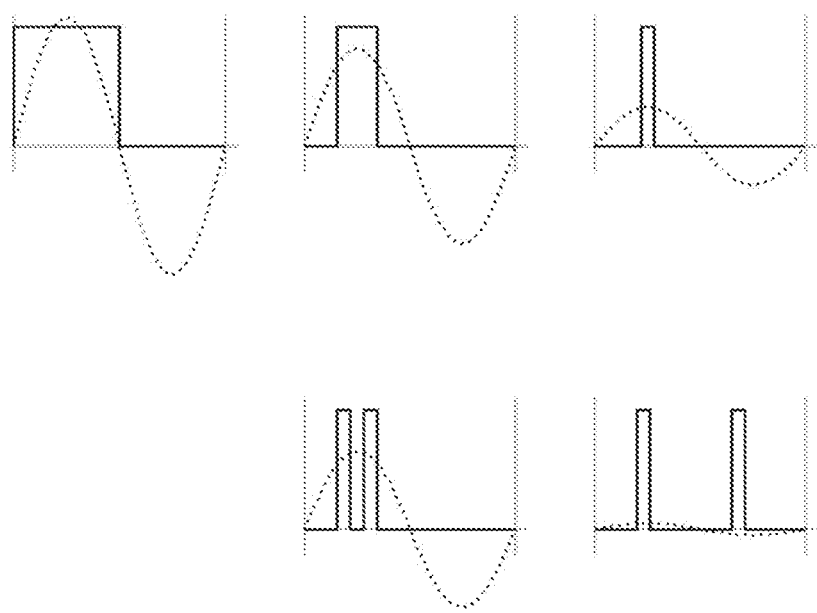
Figure 4:
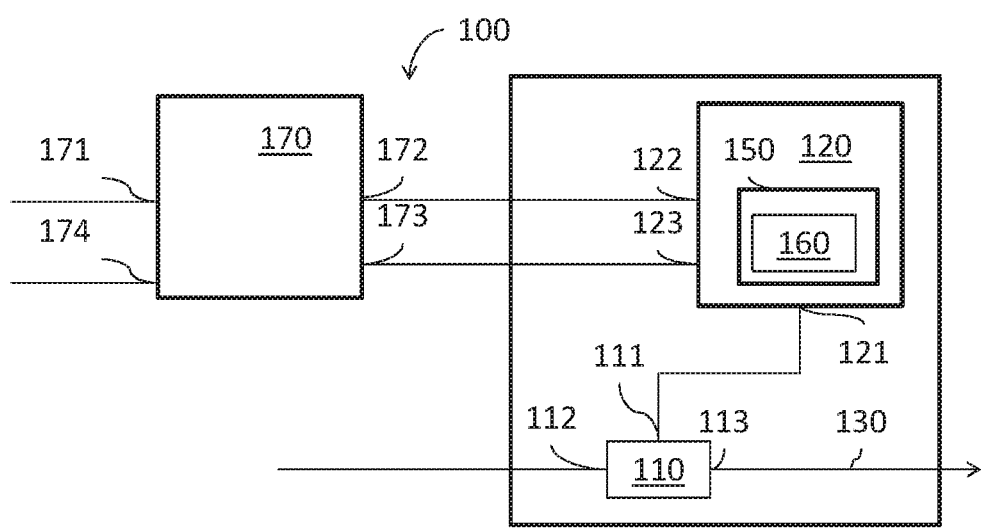
Figure 5:
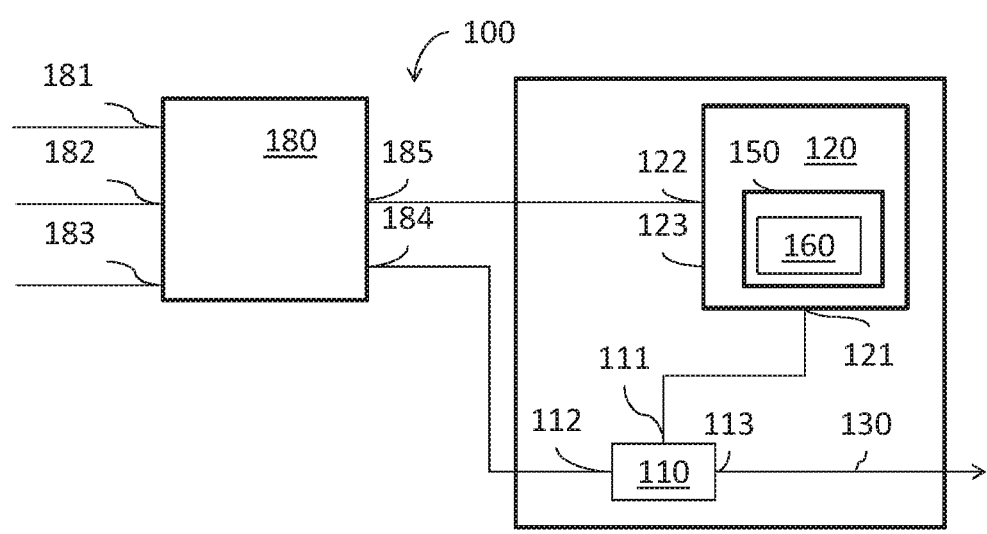
Figure 6:
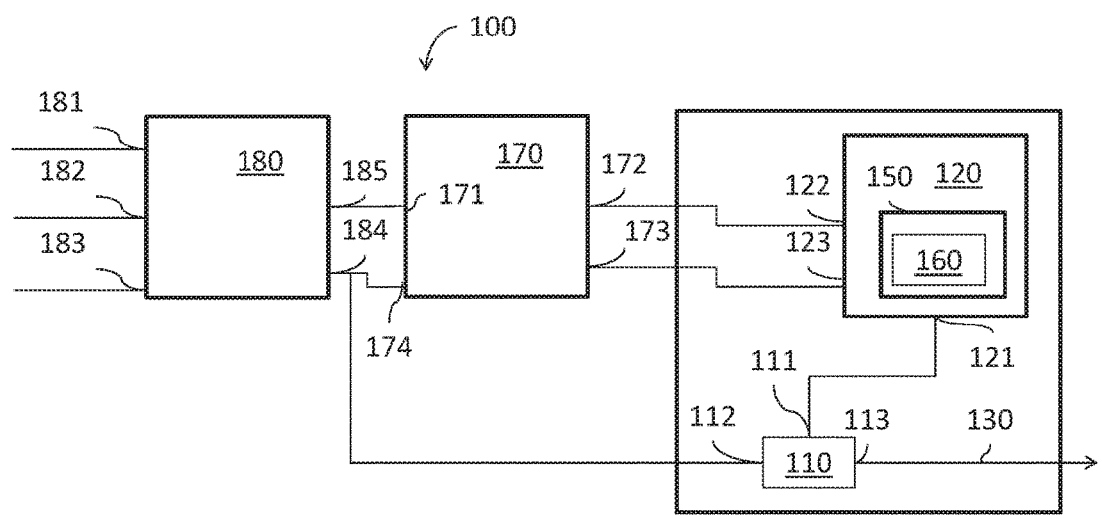
Figure 7:
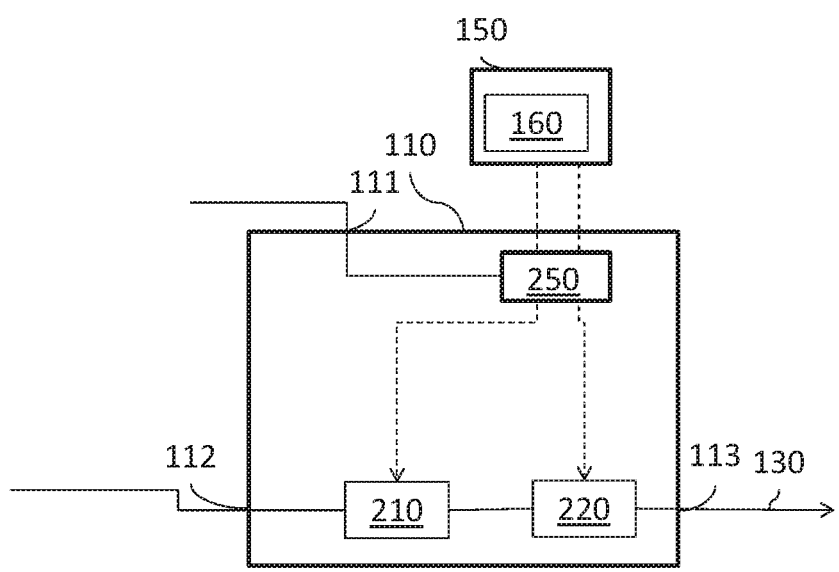
Figure 8:
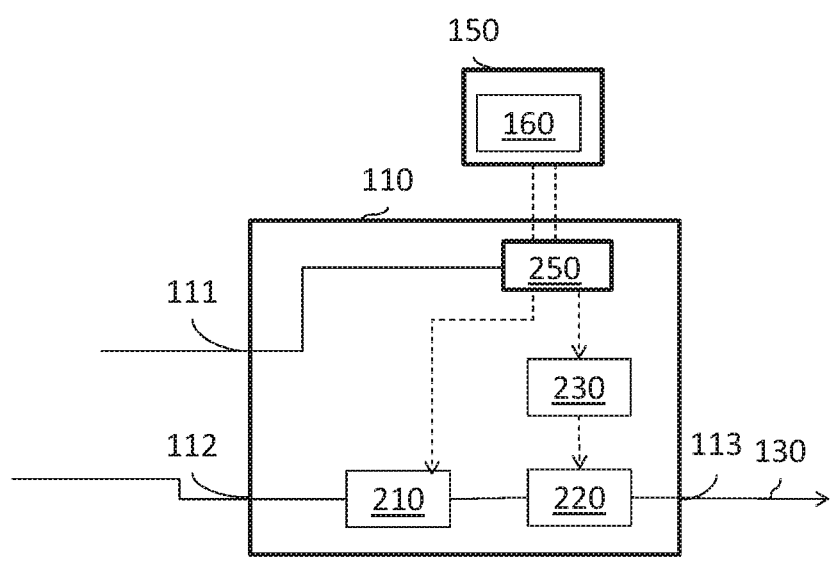
Figure 9:
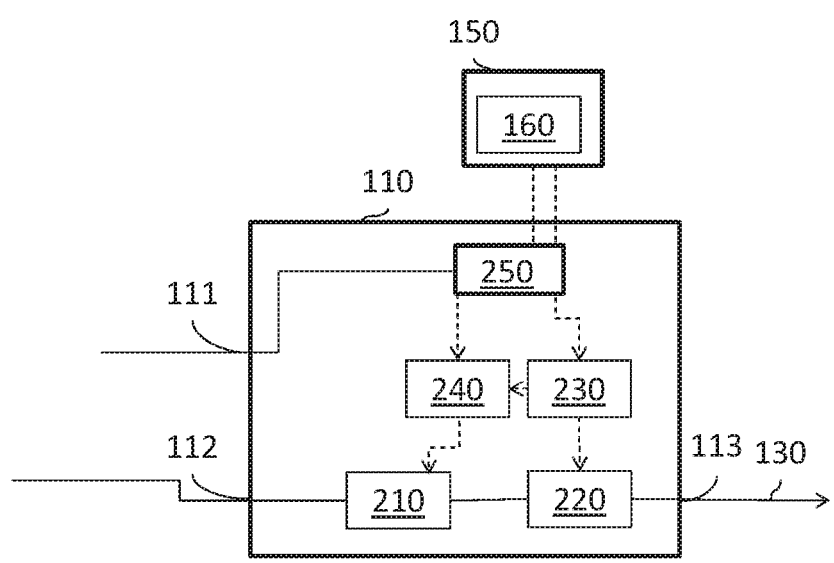
Figure 10:
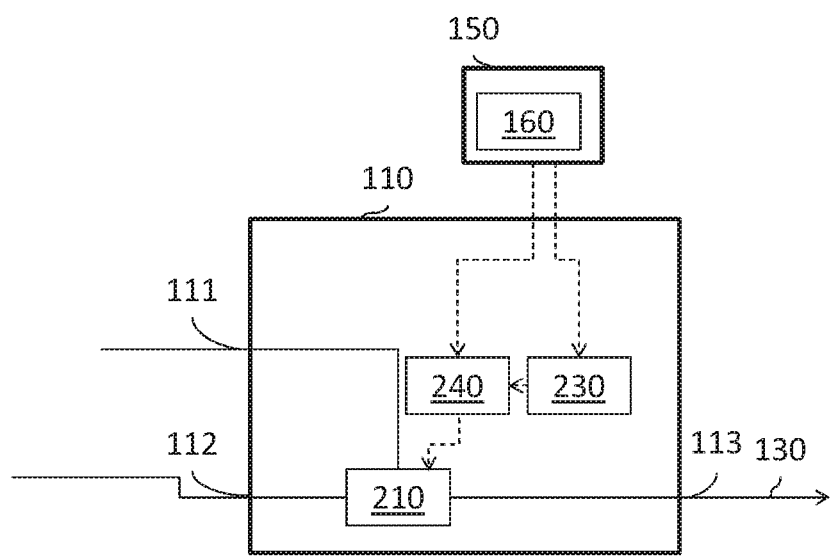
Figure 11:
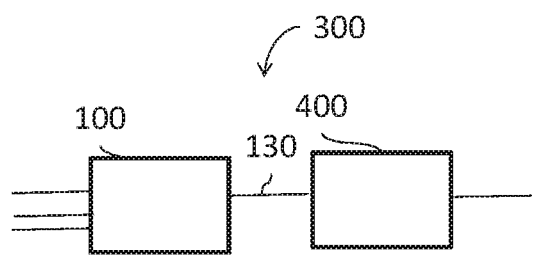
Figure 12:
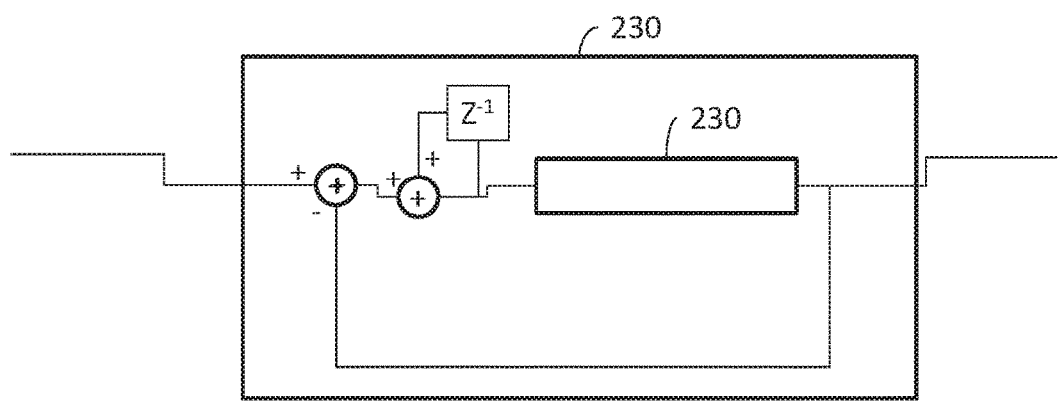

Embodiments of the invention will be explained in more detail by means of the drawings and the description below. In particular FIG. 1 shows different bit patterns for representing an exemplary amplitude value within a clock of a carrier signal, FIG. 2 shows further examples of different bit patterns for representation, FIG. 3 shows a first embodiment of the modulator according to the invention, FIG. 4 shows a second embodiment of the modulator according to the invention, FIG. 5 shows a third exemplary embodiment of the modulator according to the invention, FIG. 6 shows a fourth exemplary embodiment of the modulator according to the invention, FIG. 7 shows a first exemplary embodiment of how a pulse shaper can be used in exemplary embodiments of the invention, FIG. 8 shows a second exemplary embodiment of how a pulse shaper can be used in exemplary embodiments of the invention, FIG. 9 shows a third exemplary embodiment of how a pulse shaper can be used in exemplary embodiments of the invention, FIG. 10 shows a fourth exemplary embodiment of how a pulse shaper can be used in exemplary embodiments of the invention, FIG. 11 shows an exemplary embodiment of the device according to the invention, and FIG. 12 shows an exemplary embodiment of how a phase signal modulator can be used in exemplary embodiments of the invention.

EMBODIMENTS OF THE INVENTION

Figure 3:
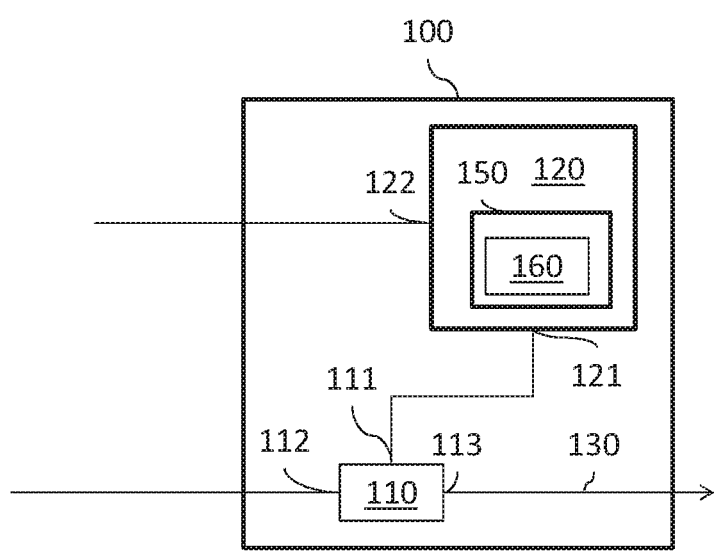

FIG. 3 shows a modulator 100 according to a first embodiment of the invention. The modulator comprises a pulse shaper 110 and a control unit 120.

The pulse shaper 110 is adapted to generate a bit stream 130 using an amplitude and a phase of the input signal and a clock frequency of a carrier signal. For each clock of the phase-modulated carrier signal, the pulse shaper generates a representation of an amplitude value of the input signal. The pulse shaper 110 can represent a respective amplitude value in different ways. For example, an amplitude value of three can be represented as three pulses of a unit width, one pulse with corresponding triple width or two pulses with a total width corresponding to three-unit widths. In addition, or alternatively, the gap width between the pulses is variable.

This is only an exemplary relationship between pulses and the resulting amplitude. FIG. 2 shows further examples. The solid line describes a respective given waveform as described in the waveform table. The dashed line represents the resulting signal behind the amplifier and bandpass filter. In FIG. 2 there is no fixed relationship between the width of all pulses taken together and the output amplitude. All pulses influence each other in their effect. This allows, for example, by a corresponding arrangement of two pulses, to achieve an output amplitude close to zero. This is shown in the last example in FIG. 2.

These different ways are also called bit patterns. The pulse shaper 110 comprises a control input 111, via which the pulse shaper can be controlled to use one of the different bit patterns by means of corresponding control commands. The pulse shaper 110 also comprises a clock input 112 and an output 113 for bit stream 130.

The control unit 120 comprises a control output 121, which is electrically connected to the control input 111 of the pulse shaper to control the pulse shaper 110. The control unit 120 also comprises an input 122, via which an amplitude of the input signal is suppliable to the control unit.

The control unit 120 is adapted to control the pulse shaper 110 to convert an input signal into the bit stream 130, wherein the control unit 120 is adapted such that the generated bit stream 130 is configured for a digital amplifier.

The control unit 120 is in particular adapted to determine the bit pattern to be generated at a clock time by the pulse shaper 110 at least by using the amplitude corresponding to the predetermined amplifier and to control the pulse shaper 110 accordingly, so that a bit current pulse generated according to the determined bit pattern is optimized for the amplifier with respect to at least one of the following amplifier parameters: efficiency, linearity, detail fidelity and signal-to-noise ratio.

In the embodiment of FIG. 3, this is done using a memory 150, in which amplitude values resulting from the amplification of the different bit patterns with the amplifier are assigned to the different bit patterns and/or associated control commands of the pulse shaper 110 in a bit pattern table 160, or such an assignment is provided. In the embodiment, the control unit 120 is adapted to determine a bit pattern for each clock of the phase-modulated carrier signal by using the bit pattern table 160 and the respective amplitude value of the input signal for concrete operation with a digital amplifier.

The modulator is thus configurable or preconfigured for a digital amplifier respectively used together with the modulator. The configuration can be adjusted at any time by updating the amplitude values stored in the bit pattern table 160 by using the amplitude values actually resulting from the amplification.

The control unit 120 does not necessarily have to be externally clocked and is therefore only optionally equipped with a clock input.

In FIG. 4 a modulator 100 according to a second embodiment of the invention is shown.

In addition to the control unit 120 shown in FIG. 3 and the pulse shaper 110, the modulator 100 of the second embodiment comprises an amplitude modulator 170.

The amplitude modulator 170 comprises an input 171 via which an amplitude of the input signal is suppliable to the control unit, and an output 172 which is electrically connected to the input 122 of the control unit 120, and at which the amplitude modulator 170 provides the amplitude of the input signal in encoded form to the control unit 120, wherein the control unit 120 of the second embodiment is further adapted to use the encoded signal to determine the bit patterns to be generated.

The amplitude modulator 170 comprises, in particular in an exemplary embodiment, a feedback input 173 and the control unit 120 an amplitude output 123, which is electrically connected to the feedback input 173, and at which the control unit 120 outputs a resulting amplitude. The amplitude modulator 170 uses the resulting amplitude, which is fed back, for encoding.

The amplitude modulator, is for example a delta-sigma modulator of the first or higher order, so that the feedback represents a negative feedback.

Since the resulting amplitude is already stored in the control unit, it can be fed back at an early stage. This reliably prevents a surge of oscillation, as it occurs when using the measured-back actual amplifier output, of the amplitude modulator 170.

Particularly in another exemplary embodiment, the amplitude modulator 170 comprises a clock input 174 to which a clock frequency of the carrier signal can be applied. In this embodiment, the amplitude modulator 170 is also adapted to encode the amplitude using the clock frequency.

In the embodiment of FIG. 4, the block 120 comprises no clock input. In another embodiment, however, the block 120 comprises a clock input which is applied, for example, to a clock, which comes from the amplitude modulator 170.

In FIG. 5 a modulator 100 according to a third exemplary embodiment of the invention is shown.

In addition to the control unit 120 shown in FIG. 3 and the pulse shaper 110, the modulator 100 of the third exemplary embodiment comprises an input stage 180.

The input stage 180 comprises three inputs 181, 182, 183 and two outputs 184, 185. I and Q components of a complex-valued representation of the input signal can be applied to two of the inputs 181, 182. The carrier signal with the clock frequency can be applied to the third input 183. If I and Q components and carrier signal are applied, the carrier signal shifted with the phase of the input signal can be extracted at output 184 and an envelope signal at output 185, which represents the amplitude of the input signal.

In the third embodiment, output 185 is electrically connected to the input 122 and output 184 is electrically connected to the clock input 112.

In the third exemplary embodiment, the modulator 100 according to the invention receives the signal to be amplified as a complex-valued input signal in in-phase/quadrature component representation (I and Q) and a representation of the desired carrier signal, for example a sinusoidal oscillation with a clock frequency. In the input stage 180, the amplitude information of the envelopes is obtained from this data.

In addition, the phase information of the input signal is used to modulate the carrier signal in the phase.

In FIG. 6, a modulator 100 according to a fourth exemplary embodiment of the invention is shown.

In addition to the control unit 120 shown in FIG. 3 and the pulse shaper 110, the modulator 100 of the fourth embodiment comprises the amplitude modulator 170 and the input stage 180.

Output 185 is electrically connected to input 171 in the fourth embodiment, and output 184 is electrically connected to clock input 112 and to clock input 174. The electrical connections between amplitude modulator 170 and control unit 120 correspond to those of the second embodiment.

FIG. 7 shows a first exemplary embodiment of a pulse shaper 110, as it can be used in exemplary embodiments of the invention.

The pulse shaper 110 comprises an m-fold oversampler (frequency multiplier) which oversamples the signal applied to clock input 112 m times and thus raises it to m times the frequency, wherein m is a number greater than or equal to one, and a bit stream serializer 210 which increases the signal at input 112 by a factor m in its frequency. Using this new, faster clock, the bit stream serializer 210 converts the selected waveform representation from the table into a bit stream. The bit pattern used to generate bits of the bit stream through the bit stream serializer 210 is determined by a selection unit 250 (selector) using the respective control command at the control input 111 and is transmitted to the bit stream serializer 210. In the example shown, the pulse shaper 110 further comprises a controllable delay line 220, via which the bit stream can be delayed in accordance with phase information determined by the selector 250, which phase information is transmitted to the controllable delay line 220.

In the first exemplary embodiment of the pulse shaper 110, the bit stream serializer 210 directly receives a parallel data word (bit pattern), which contains the data to be serialized in this step.

In the first exemplary embodiment of the pulse shaper 110, the controllable delay line 220 directly receives the phasing signal, which represents the phasing and consequently describes the extent to which the serial bit stream from the output of the bit stream serializer 210 is to be delayed.

FIG. 8 shows a second exemplary embodiment of a pulse shaper 110, as it can be used in exemplary embodiments of the invention.

In contrast to the first exemplary embodiment, the phasing signal is not supplied to the controllable delay line 220 in the second exemplary embodiment, but to an interposed phase signal modulator 230.

The phase signal modulator 230 can, for example, be a first-order or higher-order delta sigma modulator. FIG. 12 exemplarily shows a phase signal modulator 230 which discretizes a signal by means of a discretizer 235 and removes the discretized signal from an incoming phasing signal. The differential signal is integrated and supplied to the discretizer 235. The discretized signal is also available at an output of the phase signal modulator 230. The phase signal modulator 230 converts the phasing signal into a further, lower-resolution phasing signal, which has a lower resolution compared with the phasing signal.

Other modulators, which can also convert the phasing signal into a further, lower-resolution phasing signal which has a lower resolution compared with the phasing signal, can also be used. This makes it possible to deploy a controllable delay line 220 which has a coarser resolution than the phasing signal.

If the delay predefined by the further phasing signal is so great that it exceeds a bit time of the bit stream serializer, it can be advantageous to produce the delay, either wholly or partially, through the bit stream serializer.

In a third exemplary embodiment of a pulse shaper 110, as it can be used in exemplary embodiments of the invention and is shown in FIG. 9, the further phasing signal is therefore broken up by the phase signal modulator 230 into a whole-number portion and a remainder. The delay portion, which corresponds to the whole-number portion of the further phasing signal, is supplied to a bit shift unit 240. The bit shift unit 240 shifts the parallel data word by a number of bits corresponding to the whole-number portion. The shifted data word is then supplied to the bit stream serializer 210. In the third exemplary embodiment, the controllable delay line 220 merely causes a delay which corresponds to the remainder of the further phasing signal and, thus, at most to a bit time of the bit stream serializer.

The whole-number portion of the further phasing signal has an even coarser resolution than the further phasing signal.

The remainder of the further phasing signal has the same resolution as the further phasing signal, but a lower value range compared with the second exemplary embodiment, since it is less than the bit time of the bit stream serializer.

It is actually possible to dispense with the additional delay caused by the remainder and, thus, the controllable delay line 220 in many applications, in particular, but not only, if the whole-number portion of the further phasing signal corresponds to several bit times of the bit stream serializer 210. FIG. 10 shows a fourth exemplary embodiment of a pulse shaper 110, which does not comprise a controllable delay line 220, and which can be used in exemplary embodiments of the invention.

In the fourth exemplary embodiment, the further phasing signal is rounded up or down by the phase signal modulator 230 to a whole number of times the bit time of the bit stream serializer 210. The phasing signal rounded up or down to the whole number is supplied to the bit shift unit 240. The bit shift unit 240 shifts the parallel data word by a number of bits corresponding to the phasing signal rounded up or down to the whole number. The shifted data word is then supplied to the bit stream serializer 210.

FIG. 11 shows an exemplary embodiment of a device 300 according to an embodiment of the invention.

The device 300 comprises the modulator 100 according to the invention and a digital amplifier 400. The modulator 100 generates a bit stream 130 out of amplitude and phase of an input signal. The bit stream 130 is then digitally amplified by the amplifier 400. In the control unit of modulator 100, the amplitudes of digital amplifier 400 resulting from the respective bit patterns are stored in the bit pattern table assigned to the control commands.

In the exemplary embodiment of FIG. 11, the modulator 100 can be adapted in particular according to one of the exemplary embodiments of FIG. 1-4. Furthermore, in the exemplary embodiment shown in FIG. 11, the pulse shaper 110 can in particular be adapted according to one of the exemplary embodiments from FIGS. 7-10.

The modulator according to the invention can be adjusted very flexibly to the respective characteristics and possibilities of the amplifier, the pulse shaper and/or the further components.

For the control unit different implementation variants are conceivable:

In the simplest variant, the control unit selects the entry in the bit pattern table whose amplitude value corresponds to the input value of the control unit with the smallest deviation. In an extended variant, it is conceivable that the control unit deviates from this method according to defined rules in order to achieve a more advantageous behavior of the entire circuit of modulator and amplifier. For example, pulses can be omitted (a bit pattern table entry is selected that instructs the pulse shaper not to output pulses) to minimize the state changes in the amplifier and thus decrease the energy losses generated by decharging and charging losses. Many other algorithms that optimize certain parameters are conceivable.

The amplitude modulator can be designed as a delta sigma modulator of the first order. Such a delta sigma modulator can use the information of the control unit about which bit pattern has actually been selected to identify the discretization error and react accordingly. The noise shaping properties of the delta sigma modulator can be usefully applied here in order to reduce the requirements on the output filter of the amplifier and to improve the signal quality. In another variation, a delta-sigma modulator of a higher order or a completely different modulator concept can also be used. It is also conceivable to completely remove the amplitude modulator and directly supply the envelope signal of the input stage to the control unit.

The amplitude modulator and the control unit generate for each complete oscillation of the phase-modulated carrier signal each one generation instruction for the pulse shaper. With the clock divider block at the clock input of the modulation stage, however, it can also be achieved that an instruction is generated only every d oscillations of the carrier signal. The entries of the bit pattern table then contain bit patterns that are each d clocks long. In this case, d is a natural number greater than or equal to 1.

The modulator is not limited to digital amplifiers with only one (binary) input, it is also possible to operate amplifiers with several inputs. It is only necessary to extend or multiply the bit pattern generating unit accordingly and to store the additional information in the bit pattern table.

The modulator also enables to easily correct the parameters to increase the linearity of a composite of modulator and amplifier. For this purpose, the actual resulting amplitude and the actual phase position can be determined for each bit pattern stored in the bit pattern table from the output signal of the amplifier (before or after the bandpass filter). These values can then be taken over into the bit pattern table. Through the parameters that better match the actual hardware properties, an improvement in the linearity of the output signal is achieved.

In another variant it is possible to perform the described correction of the bit pattern table entries not only once but repeatedly. Since the identification of the described values can also take place on the basis of the actual useful signal, it is also possible to carry out this correction during operation. The output signal can be drawn in sections or even continuously for this task. To avoid abrupt jumps of the parameters when updating the bit pattern table, it may be useful to consider the previous values and to perform a damped or incremental and/or iterative adjustment.

An embodiment of the invention comprises a method by which an input signal can be converted into a sequence of digital pulses, which are suitable to be amplified by a digital power amplifier in such a way that the amplified input signal can be obtained from the amplified pulses by bandpass filtering.

In the embodiment there exists a bit pattern table in which suitable bit patterns are stored together with their two essential criteria—resulting amplitude and resulting phase position of the transmit signal—which can be selected as desired.

For each period of the phase-modulated signal, the encoded signal is supplied to the envelope of the control unit, which selects an entry from the bit pattern table according to specific rules and converts corresponding bit patterns defined in the table in the bit stream.

The input signal can be complex-valued and/or available in in-phase/quadrature component representation A noise shaping modulation method, such as delta-sigma modulation, can be used for amplitude modulation.

The entries in the bit pattern table can be changed during operation.

For example, entries in the bit pattern table are automatically adjusted during operation in such a way that the non-linear distortions or other properties of the modulated signal are optimized.

In another embodiment, the pulse shaper also performs a phase shift.

In another design example, the device comprises a bandpass filter subordinate to the digital amplifier, which generates the output signal by broadband filtering. In an example of this embodiment, the control unit is adapted to use the amplitude resulting from the digital amplification and the bandpass filtering or the amplitude resulting only from the digital amplification to determine the amplitude to be generated. Additionally, the resulting phase can be taken into account.

The amplitude modulator is, for example, a delta sigma modulator of the first or higher order that encodes the envelope signal by using the phase-modulated carrier signal by means of negative feedback of a resulting amplitude value associated with a bit pattern previously intended for use. The encoding can be based on a clock division of the phase-modulated carrier signal, which generates an encoded signal in d clocks of the control signal, d is a natural number greater than or equal to one. The noise shaping properties of a delta sigma modulator improve signal quality through the feedback and enable a greater variety of bandpass filters to be used due to reduced requirements.

The phase-modulated carrier signal, in turn, is provided, for example, by an in-phase/quadrature component representation that converts a complex-valued input signal into the phase-modulated carrier signal and an envelope signal using the carrier frequency.

In a first embodiment, the control unit is set to a predetermined pulse shaper and a predetermined amplifier. In a second embodiment, the control unit is only adjustable initially and/or at a later time to a predetermined pulse shaper to an actual behavior of the amplifier using the digital output signal. For example, by adjusting the assignment using the actual resulting amplitudes. In this way, the actual efficiency and/or the actual linearity of the conversion can initially and/or later, especially also recurrently, be improved, in particular optimized. The adjustment can for example be damped, iterative and/or incremental to avoid parameter jumps due to the adjustment.

The control unit is adapted to determine a bit pattern for an amplitude value of the input signal and to correspondingly control a pulse shaper so that it uses the determined bit pattern. This can be based, for example, on the control unit determining a resulting amplitude value to the amplitude value in a memory stored assignment of amplitudes resulting at least from digital amplification to bit patterns that can be used by the pulse shaper and controlling the pulse shaper to use the assigned bit pattern. For example, the resulting amplitude value with the smallest distance can be determined and used, if necessary, together with a phase position that is still assigned. The smallest distance can be determined in the entire assignment or in a subset, which in turn is determined, for example, by previously determined bit patterns. The assignment can, in particular, assign a control command for a so-called zero pulse to one or more resulting amplitude values, wherein the pulse shaper can be adapted to form no pulse if it is controlled with this control command.

For digital implementations, reconfigurable components such as field programmable gate arrays (FPGA) or application-specific processors such as application-specific integrated circuits (ASICs) exist, which enable fast adjustment of one, some and/or all parameters in the field or even during operation. Costs for customer-specific adjustments can thus be minimized. New applications requiring dynamic parameter adjustment are enabled.

Although the invention has been illustrated and described in detail by preferred embodiments, the invention is not limited by the embodiments disclosed and other variations can be derived by the skilled person without leaving the scope of protection of the invention.

The invention claimed is:

1. A modulator for a digital amplifier, comprising:
a pulse shaper; and
a control unit for controlling the pulse shaper including:
a clock input
a control input
an m-times oversampler; and
a bit stream serializer, wherein the pulse shaper is adapted to convert an input signal applied to the clock input into a bit stream configured for a digital amplifier, which encodes an amplitude value of the input signal per clock of a clock signal, wherein the pulse shaper can represent a respective amplitude value of the input signal with different bit patterns and a respective bit pattern used by the pulse shaper is determined by the control unit by means of a corresponding, associated control command applied to the control input, wherein an assignment of the control commands to associated amplitude values, resulting from amplification of the associated bit patterns with the digital amplifier is stored in the control unit and that the control unit selects a control command per clock by means of the assignment and the respective amplitude value of the input signal and controls the pulse shaper accordingly, so that a bit stream pulse generated according to the determined bit pattern is optimized for the digital amplifier with respect to at least one of the following amplifier characteristics: Efficiency, linearity, detail fidelity and signal-to-noise ratio, wherein the m-times oversampler is adapted to oversample the input signal m-times and thus raise it to m-times frequency, wherein m is a number greater than one, and wherein the bit stream serializer is adapted to increase the input signal by the factor m in its frequency and to convert it with the aid of the increased clock into a bit stream determined by the selected control command with the aid of the increased clock.

2. The modulator according to claim 1, further comprising a memory in which the assignment of the control commands to the resulting amplitude values is stored.

3. The modulator according to claim 2, wherein the control unit is adapted to change at least one associated resulting amplitude value at least once.

4. The modulator according to claim 2, wherein at least some of the bit patterns differ in assignment by different phases.

5. The modulator according to claim 1, wherein the control unit is adapted to determine the bit pattern to be generated such that a parameter which depends on a purity of the spectrum, filter requirements and/or an amplifier efficiency is optimized.

6. The modulator according to claim 1, further comprising an amplitude modulator, wherein the amplitude modulator is adapted to encode the amplitude value of the input signal and to provide to the control unit, wherein the control unit is further adapted to use the encoded signal to determine the bit patterns to be generated.

7. The modulator according to claim 6, wherein the amplitude modulator is adapted to encode the amplitude value of the input signal using a resulting amplitude value associated with a previously used bit pattern.

8. The modulator according to claim 6, wherein the amplitude modulator is adapted to encode the amplitude value using the carrier signal modulated with the phase.

9. The modulator according to claim 8 further comprising an input stage adapted to generate the phase-modulated carrier signal and an envelope signal representing the amplitude value from a complex-valued representation of the input signal and a carrier signal of the clock frequency, and to provide it to the amplitude modulator.

10. A device for converting an input signal into a digitally amplified signal, wherein the device comprises a modulator according to claim 1 and the digital amplifier.

11. A modulator for a digital amplifier, comprising:
a pulse shaper; and
a control unit for controlling the pulse shaper including:
  a clock input;
  a control input;
  an m-times oversampler; and
  a bit stream serializer,
  wherein the pulse shaper is adapted to convert an input signal applied to the clock input into a bit stream configured for a digital amplifier, which encodes an amplitude value of the input signal per clock of a clock signal,
  a memory in which the assignment of the control commands to the resulting amplitude values is stored;
  wherein the pulse shaper can represent a respective amplitude value of the input signal with different bit patterns and a respective bit pattern used by the pulse shaper is determined by the control unit by means of a corresponding, associated control command applied to the control input,
  wherein an assignment of the control commands to associated amplitude values, resulting from amplification of the associated bit patterns with the digital amplifier is stored in the control unit and that the control unit selects a control command per clock by means of the assignment and the respective amplitude: value of the input signal and controls the puke shaper accordingly, so that a bit stream pulse generated according to the determined bit pattern is optimized for the digital amplifier with respect to at least one of the following amplifier characteristics: Efficiency, linearity, detail fidelity and signal-to-noise ratio, wherein the in-times oversampler is adapted to oversample the input signal m-times and thus raise it to m-times frequency, wherein m is a number greater than one, and wherein the bit stream serializer is adapted to increase the input signal by the factor m in its frequency and to convert it with the aid of the increased clock into a bit stream determined by the selected control command with the aid of the increased clock,
  wherein at least some of the bit patterns differ in assignment by different phases.

12. The modulator according to claim 11, wherein the control unit is adapted to change at least one associated resulting amplitude value at least once.

13. A modulator for a digital amplifier, comprising:
a pulse shaper; and
a control unit for controlling the pulse shaper including:
  a clock input;
  a control input;
  an m-times oversampler;
  a bit stream serializer; and
  an amplitude modulator,
  wherein the amplitude modulator is adapted to encode the amplitude value of the input signal and to provide to the control unit, wherein the control unit is further adapted to use the encoded signal to determine the bit patterns to be generated,
  wherein the pulse shaper is adapted to convert an input signal applied to the clock input into a bit stream configured for a digital amplifier, which encodes an amplitude value of the input signal per clock of a clock signal,
  wherein the pulse shaper can represent a respective amplitude value of the input signal with different bit patterns and a respective bit pattern used by the pulse shaper is determined by the control unit by means of a corresponding, associated control command applied to the control input,
  wherein an assignment of the control commands to associated amplitude values, resulting from amplification of the associated bit patterns with the digital amplifier is stored in the control unit and that the control unit selects a control command per clock by means of the assignment and the respective amplitude value of the input signal and controls the pulse shaper accordingly, so that a bit stream pulse generated according to the determined bit pattern is optimized for the digital amplifier with respect to at least one of the following amplifier characteristics: Efficiency, linearity, detail fidelity and signal-to-noise ratio, wherein the m-times oversampler is adapted to oversample the input signal m-times and thus raise it to m-times frequency, wherein m is a number greater than one, and wherein the bit stream serializer is adapted to increase the input signal by the factor m in its frequency and to convert it with the aid of the increased clock into a bit stream determined by the selected control command with the aid of the increased clock,
  wherein the control unit is adapted to determine the bit pattern to be generated such that a parameter which depends on a purity of the spectrum, filter requirements and/or an amplifier efficiency is optimized.

14. The modulator according to claim 13, wherein the amplitude modulator is adapted to encode the amplitude value of the input signal using a resulting amplitude value associated with a previously used bit pattern.

15. The modulator according to claim 13, wherein the amplitude modulator is adapted to encode the amplitude value using the carrier signal modulated with the phase.

16. The modulator according to claim 15, further comprising an input stage adapted to generate the phase-modulated carrier signal and an envelope signal representing the amplitude value from a complex-valued representation of the input signal and a carrier signal of the clock frequency, and to provide it to the amplitude modulator.

* * * * *